(12) United States Patent
Luo et al.

(10) Patent No.: US 6,793,835 B2
(45) Date of Patent: Sep. 21, 2004

(54) SYSTEM LEVEL IN-SITU INTEGRATED DIELECTRIC ETCH PROCESS PARTICULARLY USEFUL FOR COPPER DUAL DAMASCENE

(76) Inventors: Lee Luo, 222 Brunswick Pl., Fremont, CA (US) 94539; Claes H. Bjorkman, 1532 California St., #5, Mountain View, CA (US) 94041; Brian Sy Yuan Shieh, 3727 Louis Rd., Palo Alto, CA (US) 94303; Gerald Zheyao Yin, 5511 Country Club Pkwy., San Jose, CA (US) 95138

( * ) Notice: Subject to any disclaimer, the term of this patent is extended or adjusted under 35 U.S.C. 154(b) by 0 days.

(21) Appl. No.: 10/280,664

(22) Filed: Oct. 24, 2002

(65) Prior Publication Data

US 2003/0057179 A1 Mar. 27, 2003

Related U.S. Application Data

(63) Continuation of application No. 09/538,443, filed on Mar. 29, 2000, now Pat. No. 6,500,357.
(60) Provisional application No. 60/173,412, filed on Dec. 28, 1999.

(51) Int. Cl.[7] .................................... H01L 21/302
(52) U.S. Cl. ..................... 216/79; 216/41; 216/67; 438/724; 438/725; 438/732; 438/740
(58) Field of Search .................... 216/41, 67, 79; 438/724, 725, 732, 740

(56) References Cited

U.S. PATENT DOCUMENTS

| | | |
|---|---|---|
| 4,842,683 A | 6/1989 | Cheng et al. |
| 5,534,108 A | 7/1996 | Qian et al. |
| 5,578,163 A | 11/1996 | Yachi |
| 5,622,565 A | 4/1997 | Ye et al. |
| 5,665,203 A | 9/1997 | Lee et al. |
| 5,674,321 A | 10/1997 | Pu et al. |
| 5,785,875 A | 7/1998 | Hawthorne et al. |
| 5,811,357 A | 9/1998 | Armocost et al. |
| 5,855,681 A | 1/1999 | Maydan et al. |

(List continued on next page.)

FOREIGN PATENT DOCUMENTS

| | | |
|---|---|---|
| EP | 0709488 A1 | 5/1996 |
| EP | 1049133 A2 | 11/2000 |
| WO | WO 00/26954 A1 | 5/2000 |

OTHER PUBLICATIONS

R. Wu et al., "2–in–1 Total Process Integration in MERIE Etch Chamber for Cu Dual Damscene Applications," 2000/IEEE/SEMI Advanced Semiconductor Manufacturing Conference, pp. 278–280 (2000).

(List continued on next page.)

Primary Examiner—Nadine G. Norton
Assistant Examiner—Shamim Ahmed
(74) Attorney, Agent, or Firm—Townsend and Townsend and Crew; Joseph Bach

(57) ABSTRACT

An integrated in situ etch process performed in a multi-chamber substrate processing system having first and second etching chambers. The process includes transferring a substrate having formed thereon in a downward direction a patterned photoresist mask, a dielectric layer, a stop layer and a feature in the substrate to be contacted into the first etching chamber to etch the dielectric layer. The substrate is then transferred from the first etching chamber to the second etching chamber under vacuum conditions and, in the second etching chamber, is exposed to an oxygen plasma or similar environment to strip away the photoresist mask deposited over the substrate. After the photoresist mask is stripped, the stop layer is etched through to the feature to be contacted in either the second or a third etching chamber of said multichamber substrate processing system. All three etching steps are performed in a system level in situ process so that the substrate is not exposed to an ambient between steps.

12 Claims, 7 Drawing Sheets

U.S. PATENT DOCUMENTS

| | | | |
|---|---|---|---|
| 5,902,704 A | | 5/1999 | Schoenborn et al. |
| 5,970,373 A | * | 10/1999 | Allen .......................... 438/624 |
| 6,069,091 A | | 5/2000 | Chang et al. |
| 6,176,667 B1 | | 1/2001 | Fairbairn et al. |
| 6,211,092 B1 | | 4/2001 | Tang et al. |
| 6,254,689 B1 | | 7/2001 | Meder |
| 6,296,988 B1 | | 10/2001 | Lee |
| 6,380,096 B2 | | 4/2002 | Hung et al. |
| 6,500,357 B1 | * | 12/2002 | Luo et al. ...................... 216/79 |
| 2002/0022281 A1 | | 2/2002 | Flanner et al. |
| 2003/0047464 A1 | | 3/2003 | Sun et al. |
| 2003/0150530 A1 | | 8/2003 | Lin et al. |
| 2003/0205479 A1 | | 11/2003 | Lin et al. |

OTHER PUBLICATIONS

P. Hsieh, "An Integrated Approach to Patterning Dual Damascene Structures in Low–k Materials," SEMICON Korea presentation, pp. 1–25 (Jan. 2002).

P. Hsieh, "The Challenges of Post Etch Treatment on Low–k Dual Damascene," NCCAVS Plasma Etch Users Group presentation, pp. 1–26 (Sep. 2001).

G. Hseuh et al., "An Integrated Etch, Strip, and Barrier Removal Approach to Manufacturing Dual Damascene," NCCAVS Plasma Etch User Group presentation, pp. 1–23 (Apr. 2001).

P. Hsieh et al., "An Integrated Etch Solution for Cu/Low–k Interconnects: Single Wafer Infancy to Production Level Maturity," 2001 International Interconnect Technology Conference, Hyatt Regency, San Francisco Airport Hotel, Burlingame, CA—Jun. 4–6, 2001, pp. 1–21 (Jun. 2001).

P. Hsieh et al., "eMAX Dual Damscene Etch: Capabilities on Low–k ILD," 2001 International Interconnect Technology Conference, Hyatt Regency, San Francisco Airport Hotel, Burlingame, CA—Jun. 4–6, 2001, pp. 1–13 (Jun. 2001).

R. DeJule, "Dual Damascene: Overcoming Process Issues," *Semiconductor International*, website http://www.semiconductor.net, pp. 1–9 (Jun. 2000).

B. Guerra, "Developing a Modified ICP Process to Strip Resist Without Damaging Low–k Dielectric Film," Micromagazine.com, pp. 1–12 (Apr. 2001).

Q. Han et al., "Enabling Low–k Material Integration Through Low–ion Plasma Dry Strip Processes," Micromagazine.com, pp. 1–12 (Oct. 1999).

C.W. Kaanta et al., "Dual Damascene: A ULSI Wiring Technology," Jun. 11–12, 1991 *VMIC Conference, IEEE,* pp. 144–152 (Jun. 1991).

H. Shan et al., "MxP+: A New Dielectric Etcher With Enabling Technology, High Productivity, and Low Cost–of–Consumables," *J. Vac. Sci. Technol. B.,* vol. 14, No. 2, pp. 716–723 (Mar./Apr. 1996).

Lam Research, "Lam Research Corporation Releases Dual Damascene Applications for 4520XL$_E$™—Now in Uses in Copper Production at a Major U.S. Chip Manufacturer," Lam Research Press Release from website http://www.lam-rc.com/inside/news/releases/1998/f19980922.html, pp. 1–2 (Sep. 1998).

Z. Sui et al., "Integrated Process Control Using An In–Situ Sensor for Etch," *Solid State Technology* (Apr. 2002).

Nanometrics, Integrated Metrology™ Presentation (Jan. 2001).

Z. Sui et al., "Innovative In–situ Sensor Process Control for Nex–Generation Dual Damscene Trench Etch and Spacer Etch Applications," pp. 1–4 (Nov. 2001).

* cited by examiner though non-stoichiometric ratios $SiN_x$ are
SYSTEM LEVEL IN-SITU INTEGRATED DIELECTRIC ETCH PROCESS PARTICULARLY USEFUL FOR COPPER DUAL DAMASCENE

CROSS-REFERENCES TO RELATED APPLICATIONS

This application claims priority from U.S. Provisional Application Serial No. 60/173,412, entitled SYSTEM LEVEL IN-SITU INTEGRATED DIELECTRIC ETCH PROCESS PARTICULARLY USEFUL FOR COPPER DUAL DAMASCENE, by Lee Luo Claes H. Bjorkman, Brian Sy Yuan Shieh and Gerald Zheyao Yin, filed Dec. 28, 1999. The disclosure of No. 60/173,412 is incorporated herein by reference. This application also claims priority as a continuation of U.S. patent application Ser. No. 09/538,443, filed March 29, 2000 now U.S. Pat. No. 6,500,357, incorporated by reference herein.

BACKGROUND OF THE INVENTION

The present invention relates to plasma etch processes used in the manufacture of semiconductor integrated circuits. More specifically, the present invention relates to a system level in situ integrated process for etching layered dielectric structures serving as inter-level dielectric layers.

The technology of fabricating semiconductor integrated circuits continues to advance in the number of transistors, capacitors and other electronic devices that can be fabricated on a single integrated circuit chip. This increasing level of integration is being accomplished in large part by decreasing the minimum feature sizes of the integrated circuits. The increasing level of integration has also resulted in an increase in the number of layers that make up the integrated circuit. Even as the number of layers in the integrated circuit continues to increase, advanced processes are being developed which allow for a reduction in the number of processing steps for a functional layer. However, these advanced processes often make extraordinary demands upon the chemistry of the etching process. Dielectric etching has presented some of the most difficult demands.

In the past the common materials for inter-level dielectric have been based upon silicon-based oxide materials that serve as electrical insulators, such as undoped silicon oxide, fluorine-doped silicon oxide and other related materials. Recently, interest has developed in insulating materials with even lower dielectric constants (e.g., low-k dielectrics with a k value less than 3), some of which are based upon silicon but others are based upon carbon.

Many advanced integrated circuits contain multiple wiring layers separated from the silicon substrate and from each other by respective dielectric layers. Particularly logic circuitry, such as microprocessors, employ several layers of metallization with intervening inter-level dielectric layers. Small via holes need to be etched through each of the dielectric layers. The via holes are then filled with a conductor, composed typically of aluminum or tungsten in the past but more recently composed of copper. A horizontal wiring layer is formed over one dielectric layer and then covered by another dielectric layer. The horizontal wiring and the underlying vias are often referred to as a single wiring layer. The conventional process not only fills the via holes but also overfills them to form a thick planar layer over both the filled holes and the dielectric. Conventionally, a metal lithographic step then photographically defines a photoresist layer over the planar metal layer and etches the exposed metal into a network of conductive interconnects.

In contrast, a recently developed damascene process substitutes chemical mechanical polishing for metal etching. A dual damascene structure, as illustrated in sectioned isometric view of FIG. 1, has been proposed for advanced chips which avoids the metal etching and combines the metallization of the via and horizontal interconnect. There are two general types of dual damascene processes, self-aligned and counterbore, both of which produce the structure of FIG. 1.

A substrate 10 includes a conductive feature 11 in its surface. If substrate 10 already includes a wiring level at its surface, the conductive feature 11 is metallic and may be a previously formed dual damascene metallization. The interconnection between two metallic wiring levels is called a via. Conventionally, the metal forming the metallization has been aluminum and its alloys or tungsten, but many advanced integrated circuits are now being designed with copper metallization. Alternatively, conductive feature 11 may be a doped region in silicon substrate 10, for example, a source or drain. In this case, the interconnection between the silicon layer and a first metallization layer is called a contact. Although some aspects of the present invention apply to contacts, the major portion of the disclosure and the details of the invention are directed to vias, particularly copper vias and underlying copper lines 11.

A lower stop layer 12, a lower dielectric layer 14, an upper stop layer 16, and an upper dielectric layer 20 are deposited over substrate 10 and included conductive feature 11. Stop layers 12, 16 have compositions relative to those of dielectric layers 14, 20 such that an etch chemistry is available which effectively etches a vertical hole in the overlying dielectric layer 14, 20 but stops on the stop layer 12, 16. That is, the etch selectively etches the dielectric layer over the stop layer. Alternatively stated, the dielectric etch is selective to the stop material. As mentioned before, more advanced circuits are being designed with the two dielectric layers 14, 16 being composed of a dielectric material having a lower dielectric constant than that of silicon dioxide. However, the specific examples of the invention described here use undoped silicon oxide, related non-stoichiometric materials $SiO_x$, and related doped silica glasses for the dielectric, such as fluorinated silica glass (FSG), e.g., F-TEOS which exhibits much the same chemistry as $SiO_2$. These materials will be hereafter collectively be referred to a oxides. The typical stop material for oxide is silicon nitride ($Si_3N_4$) although non-stoichiometric ratios $SiN_x$ are included where x may be between 1.0 and 1.5. These materials will hereafter be referred to a nitrides. An advantage of the combination of oxide and nitride is that both materials can be grown in a single reactor by plasma-enhanced chemical vapor deposition (PECVD). For example, silicon oxide can be grown under PECVD using tetraorthosilicate (TEOS) as the main precursor gas. Silicon nitride can be grown in the same reactor using silane as the main precursor in the presence of a nitrogen plasma. These examples are non-limiting and simply show the advantage of the illustrated vertical structure.

The dual damascene etch structure shown in FIG. 1 is formed in the previously described vertical structure. FIG. 2 is a flowchart illustrating one processing sequence that can be performed to etch the dual damascene structure shown in FIG. 1. As shown in FIG. 2, after all the dual damascene layers 12, 14, 16, 20 are grown in a horizontally unpatterned vertical structure (step 74), a photoresist layer is deposited over upper oxide layer 20 and patterned with apertures corresponding to the via holes 18 (step 76). Next, an extended via hole is etched from the top of upper oxide layer 20 to the top of lower nitride stop layer 12 using a multistep etch process that must etch very deeply, for example, 2.5 μm through a very narrow hole (e.g., hole widths of 0.25 or 0.18 μm). This multistep etch process (step 78) is rather demanding and must take the possibility of etch stop into consideration. (Etch stop arises from the fact that the high selectivity of fluorocarbon-based oxide etches to underlying silicon or silicon nitride as well as verticality of the side walls depend upon a polymer depositing on non-oxide surfaces and on the side walls. However, if the etching chemistry is too rich, favoring too much polymer formation, the polymer bridges the sidewalls and covers the oxide bottom of the developing hole and prevents further etching.) Earlier steps in this multistep etch process must etch through both the upper oxide layer and the upper nitride etch stop layer while the final step of the process requires good selectivity to underlying lower nitride stop layer 12. Two examples of single chamber, in situ processes suitable for etch step 78 are presented in U.S. application Ser. No. 09/201,590, entitled "In situ Dielectric Etch Process for IC Structures Using Copper Interconnects," having co-inventors Hung et al. and assigned to Applied Materials, the assignee of the present invention.

At the completion of multistep etch 78, a photoresist layer (not shown in FIG. 1) is deposited over the top of the upper oxide layer 30 and patterned to the area of the trench 22. Next, in a trench etch step (step 82), upper oxide layer 20 is etched down to upper nitride stop layer 16, thereby forming trench 22. After trench etch 82, the photoresist layer is stripped (step 84) in a process that also removes any polymer produced during trench etch 82. Stripping the photoresist in step 84 is sometimes referred to as ashing. Finally, lower nitride layer 12, which lies exposed at the bottom of via hole 18, is removed to expose contact or metal layer 11 (step 86).

The result of the above process is that a generally circular via hole 18 is etched through the lower oxide layer 14 and the lower nitride stop layer 12 to reach the underlying conductive feature 11. Multiple such via holes 18 are etched to reach different ones of the conductive features 11. Trench 22 extends along the surface of substrate 10 and is etched through upper oxide layer 20 and upper nitride stop layer 16.

After completion of this dual damascene etch structure, trench 22 and vias 18 are filled with a metal such as aluminum or copper. Physical vapor deposition (PVD) is the usual process for depositing the metal though it may be combined with chemical vapor deposition (CVD) or replaced by electro or electroless plating. Barrier layers are usually first conformally coated in the hole being filled. A typical barrier for copper includes Ta/TaN. The metal is deposited to a thickness that overfills the trench 22 and also covers a top planar surface 30 of the upper oxide layer 30. Chemical mechanical polishing (CMP) is applied to the top surface of the wafer. CMP removes the relatively soft exposed metal but stops on the relatively hard oxide layer 20. The result is a horizontal metal interconnect within the trench 22 and multiple vertical metal interconnects (vias) in the via holes 18.

As can be appreciated by those of skill in the art, the dual damascene etch process described above requires differing etch chemistries and etch capabilities for the steps used to etch through the silicon oxide layer, strip the photoresist and etch through the silicon nitride stop layer (steps 82, 84, 86). Because of the different demands such processes place on substrate etching equipment and limitations in the equipment itself, many integrated circuit (IC) fabrication facilities employ separate pieces of equipment or systems within the fab to perform each step of the above described oxide etch sequence. Such an arrangement of equipment provides for an ex situ etch process because substrates must be transferred within the clean room between the various pieces of equipment. Exposure of the wafers to the air environment during the transfer between vacuum chambers may result in corrosion of the metal features of the partially processed integrated circuit. The well known susceptibility of copper to corrosion in air increases the destructive risk. Also, carbon-based residue that forms on the interior of the reactor chamber over time can redeposit on exposed copper surfaces. Since these carbon based residues can be extremely difficult to remove from copper, their presence can adversely impact upon subsequent formation of electrical contacts to the copper.

Furthermore, such an ex situ process may result in the formation of a polymer at the bottom of the contact or via area 18. Thus, many integrated circuit manufactures that employ an ex situ process for steps 82, 84, 86 further perform a wet solvent etch by, e.g., dipping the substrate in an HF solution, just prior to depositing the metallization in hole 18 and trench 22. This wet solvent etch is shown in FIG. 2 as step 88.

Engineers at Applied Materials, the assignee of the present invention, have developed an oxide etch process that can be implemented in a single etch reactor thus eliminating the problems associated with exposing the substrate to the ambient during the etch process. One version of this single chamber etch process is described in U.S. application Ser. No. 09/201,590 referred to above. The process described in the Ser. No. 09/201,590 application provides an improvement in both etching results and cost of ownership as compared to previously known ex situ oxide etch processes. The process also can be satisfactorily used to form dual damascene structures without requiring a wet solvent dip 88 prior to filling hole 18 and trench 22 with metal.

The dual damascene dielectric trench etch, and in particular oxide trench etch, is expected to be one of the primary steps in the fabrication of future advanced integrated circuits and industry sources predict that the market for the oxide etch solution is one of the largest, if not the largest, markets for equipment substrate processing manufacturers. Thus, while the single chamber in situ oxide etch solution described in the above patent application provides a distinct improvement over ex situ processes, alternative methods of performing the oxide etch are desirable.

Cost of ownership (COO) of one or more substrate processing tool(s) to perform a particular process can be defined as the cost of the tool(s) to own and operate to process substrates according to the particular process over a fixed period of time. COO is an important criteria for semiconductor manufacturers when determining what equipment to purchase for a fabrication facility. COO takes into consideration the overall purchase price of the processing tool(s) and their depreciation, the amount of space the tool(s) require in a fab clean room, the cost to operate the tool(s) including the cost to replace consumable parts, cost of various gases and raw materials used by the tool(s), the throughput of the tool(s), the amount of downtime during which the tool(s) cannot be used, the yield of wafers processed with the tool(s) and other criteria. Because of the large investment required to set up and maintain a IC fabrication facility in today's business environment, semiconductor manufacturing companies consider COO an important criteria in deciding equipment purchases. Accordingly, it is desirable for semiconductor equipment manufacturers to provide low COO solutions for the processes demanded by semiconductor manufacturing companies for the fabrication of modem integrated circuits.

SUMMARY OF THE INVENTION

The present invention provides a system level in situ method of performing the dielectric etch process, such as the sequence of steps 82, 84, 86 shown in FIG. 2, in a multichamber substrate processing system that has a significantly reduced cost of ownership as compared to either previously known ex situ systems or single chamber in situ systems. The method transfers the substrate to be processed among different application chambers in the multichamber system under vacuum conditions so as to not expose the substrate to an ambient between the various steps of the etch sequence.

The present inventors performed detailed studies related to the cost of ownership of various hardware configurations that can satisfactorily perform the oxide etch process of steps 82, 84, 86 for modem integrated circuits having minimum feature sizes of 0.25 $\mu$m or below.

In one embodiment the method of the present invention is an integrated etch process performed in a multichamber substrate processing system having first and second etching chambers. The process includes transferring a substrate having formed thereon in a downward direction a patterned photoresist mask, a dielectric layer, a stop layer and a feature in the substrate to be contacted into the first etching chamber to etch the dielectric layer. The substrate is then transferred from the first etching chamber to the second etching chamber under vacuum conditions and, in the second etching chamber, is exposed to reactive plasma such as oxygen to strip away the photoresist mask deposited over the substrate. After the photoresist mask is stripped, the stop layer is etched through to the feature to be contacted in either the second or a third etching chamber of said multichamber substrate processing system. All three etching steps are performed in a system level in situ process so that the substrate is not exposed to an ambient between steps.

In one particular embodiment, the system level in situ process of the invention is designed to perform an oxide etch process. In this embodiment, the first chamber is a high performance etch chamber that has the capability of performing the relatively demanding oxide etch step, such as step 82. In one version of this embodiment, the first chamber is a magnetically enhanced reactive ion etch (MERIE) chamber. In another version of this embodiment, the first chamber includes separately controlled plasma source power and plasma bias power and a two stage vacuum pump system that includes both mechanical and turbo pumps. The second chamber, on the other hand, is simpler in design and has only a single mechanical vacuum pump. In one embodiment the second chamber also includes a remote plasma system as opposed to separate plasma source and bias power controls while in a different embodiment the second chamber is a parallel plate etch chamber having a single frequency plasma source power control without a separate control for bias power. In this manner, cost of ownership can be reduced because an in situ system provides significant benefits as compared to an ex situ system including throughput, process performance and space requirements, among others. Furthermore, such a multichamber system level in situ process provides a reduced cost of ownership as compared to a single chamber system because the single chamber system includes hardware capabilities that while being necessary for a relatively demanding etch step such as the oxide etch are not required for a less demanding etch step such as the photoresist strip or nitride open steps.

These and other embodiments of the present invention, as well as its advantages and features, are described in more detail in conjunction with the text below and attached figures.

DESCRIPTION OF THE SPECIFIC EMBODIMENTS

I. Introduction

Figure 1:
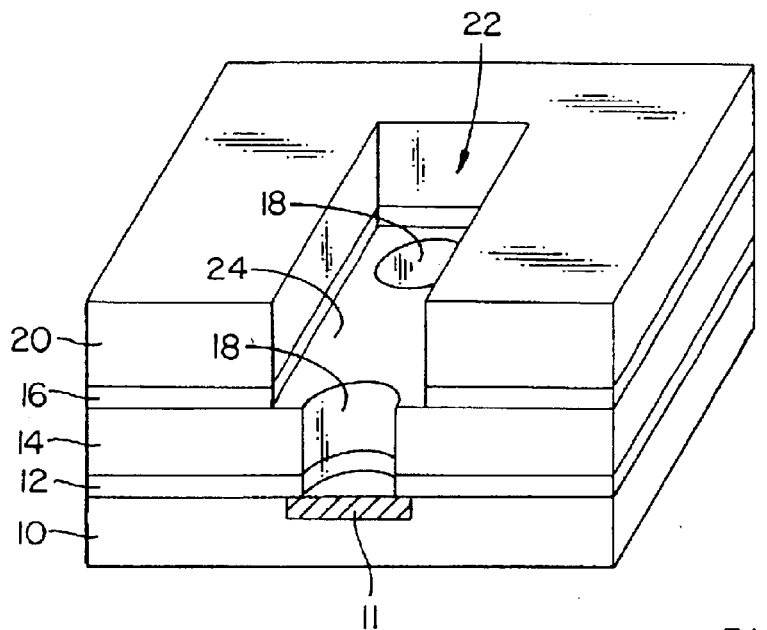
FIG. 1 is a sectioned isometric view of a dual damascene structure for which the method of the present invention may be used to form.
Figure 2:
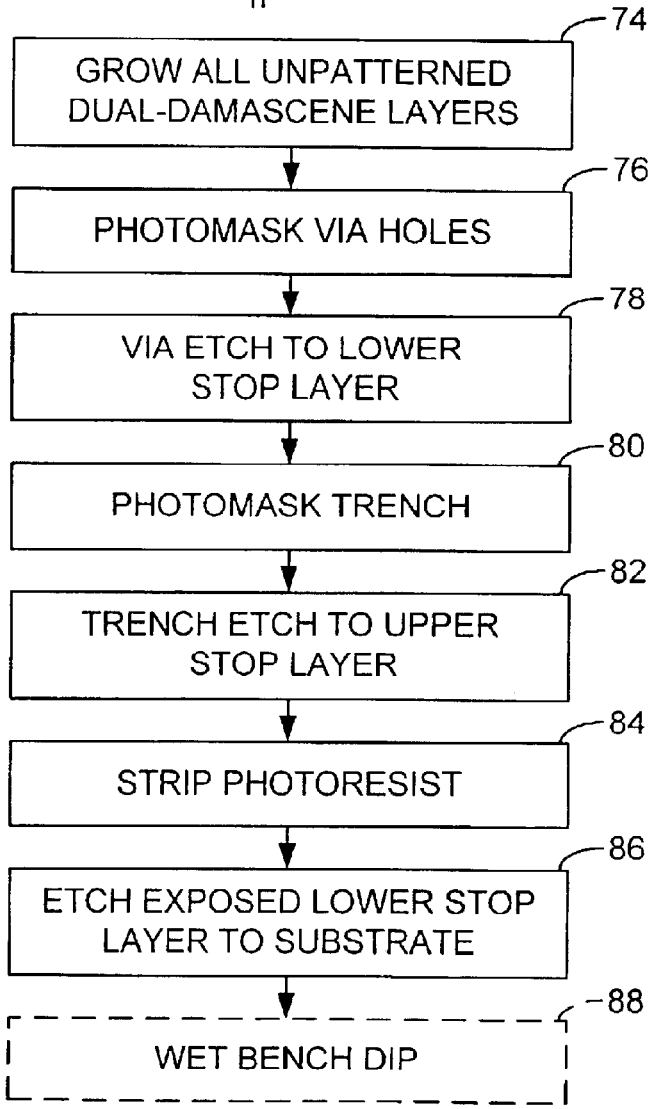
FIG. 2 is a flowchart illustrating one processing sequence that can be performed to etch the dual damascene structure shown in FIG. 1.

As previously stated, the dielectric etch sequence such as oxide etch sequence 82, 84, 86 (sometimes referred to herein as the "dielectric etch sequence") may be one of the most common sequence of steps used by integrated circuit manufacturers to produce future integrated circuits. The dielectric etch sequence is used in the formation of vias in standard integrated circuit manufacturing techniques and in damascene and dual damascene processes. Recognizing the importance of the dielectric etch sequence to the semiconductor industry, the present inventors undertook a detailed analysis of the cost of ownership of a variety of approaches used to perform the process. This analysis included evaluating solutions currently offered by the inventors' current company, Applied Materials the assignee of the present invention, as well as solutions offered by other prominent semiconductor equipment manufacturing companies.

As a result of this analysis the present inventors concluded that the current single chamber in situ oxide etch process offered by Applied Materials using either an IPS or MERIE chamber provides significant cost and performance advantages over known ex situ solutions offered by other companies. Despite this conclusion, the inventors undertook the challenge of coming up with a solution to the dielectric etch process that had a cost of ownership even less than that of the current solutions offered by Applied Materials.

The effort of this undertaking resulted in the development of the system level in situ multichamber substrate processing system according to the present invention. At least part of the solution to reducing the cost of ownership beyond that of the single chamber in situ solution is the realization that the single chamber in situ process requires equipment that must be capable of performing all three steps of the dielectric etch process. Developing such equipment (the chamber used for the single chamber in situ process) was a significant undertaking and required that the chamber include hardware that can perform the process steps necessary for each of etch steps 82, 84, 86 even though some of the hardware necessary to perform step 84 or 86 satisfactorily may not be necessary to perform step 82 or vice versa. Thus, while a single chamber can be designed to perform all three etch steps, when the steps require different functionality that can only be achieved or can be best achieved by different hardware configurations, the single chamber by definition includes hardware that is not necessary for some of the steps. Thus, while a single chamber design can be optimized to perform all three steps, such a design comes at the expense of extra cost.

On the other side of the coin, however, another part of the solution to reducing the cost of ownership for equipment to perform the oxide etch process is the realization that an in situ system is capable of providing numerous benefits not attainable by an ex situ system that uses different pieces of equipment for each of steps 82, 84, 86. First of all, in order to meet manufacturing specifications for many processes, such ex situ systems require a separate wet bench to perform step 88. Also, in situ systems are capable of higher throughput because of less wafer transfer time, are capable of higher wafer yields because of reduced particle contamination and require less floor space in a fabrication facility among other things as compared to ex situ systems.

In order to address all of these issues, the present inventors designed a multichamber substrate processing system that has one chamber designed and optimized to perform the oxide or other type of dielectric layer etch and one or more other chambers designed and optimized to perform the stop layer etch and/or photoresist strip operations. Several different chamber configurations can be arranged to achieve overall reduced COO of equipment necessary to carry out the dielectric etch process according to the present invention. Examples of each of these configurations are shown in FIGS. 3A–3D, which are simplified diagrams of various multichamber substrate processing systems according to the present invention. In each of the configurations shown in FIGS. 3A–3D the multichamber platform is based on the Centura multichamber platform manufactured by Applied Materials. It is to be understood, however, that the present invention can be used other multichamber systems as long as wafers can be transferred from one chamber to another without being exposed to the ambient of the clean room.

Figure 3A:
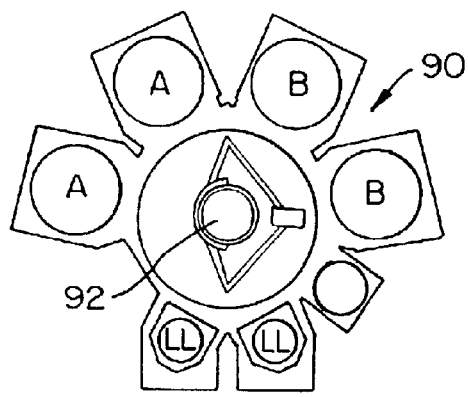
FIGS. 3A–3D are simplified diagrams of various multichamber substrate processing systems according to the present invention.

FIG. 3A shows a four chamber Centura platform that includes two separate high performance etch chambers (chambers A) to perform oxide etch step 82 and two chambers (chambers B) optimized to perform both photoresist strip and nitride etch steps 84, 86. Generally, chamber B could not be used to satisfactorily etch the oxide dielectric layers to the relatively demanding standards that high performance etch chambers A are able to etch oxide layers to. As used herein, a "high performance etch" chamber is a chamber that can satisfactorily perform the dielectric etch process of steps 82, 84 and 86 for integrated circuits having a minimum feature size of 0.25 μm or below. This may require, for example in the oxide etch process, etching a via with at least an aspect ratio of 6:1 with an 89° or greater vertical profile at both the top and bottom of the via to maintain the critical dimension at such feature sizes. Chambers A generally can, but do not necessarily have to be able to perform the relatively less demanding photoresist strip and stop layer etch steps.

Figure 3B:
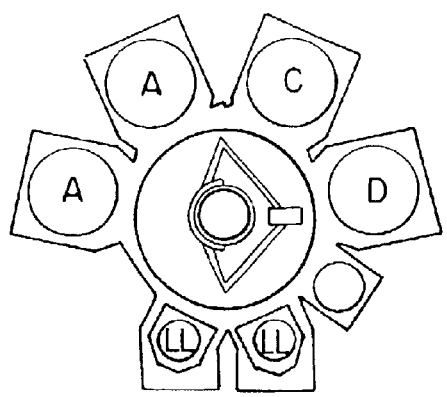
Figure 3C:
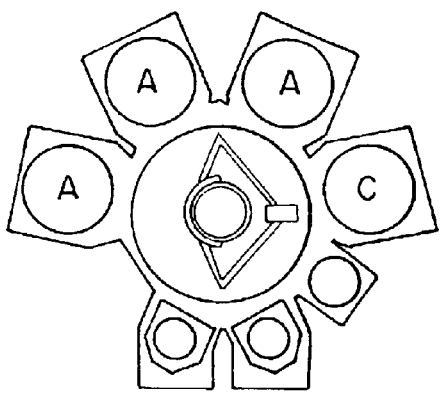
Figure 3D:
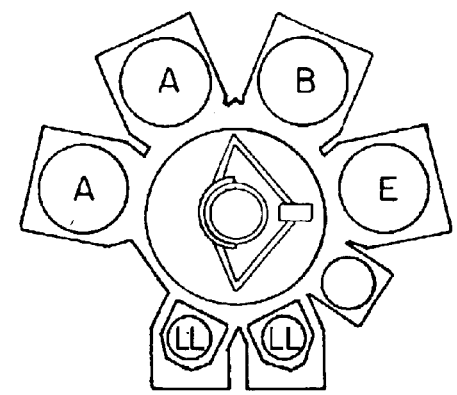

FIG. 3B shows a similar four chamber Centura platform that includes two separate chambers (chambers A) optimized to perform oxide etch step 82, a third chamber (chamber C) designed and optimized to perform photoresist strip step 84 and a fourth chamber (chamber D) designed and optimized to perform nitride etch step 86. FIG. 3C shows a multichamber platform having three high performance etch chambers A and one chamber C. Two of the chambers A are used for oxide etch step 82 and a third is used for nitride etch step 86. Chamber C, on the other hand, is used for photoresist strip step 84. Finally, in a fourth configuration, FIG. 3D shows a multichamber platform having two chambers A, a chamber B and a chamber E. Chambers A are used for oxide etch step 82, while chamber B is used for both the photoresist strip and nitride etch steps 84, 86. Chamber E on the other hand is a wet clean processing chamber that can be used to remove any polymer formation that may form in the via area 18 after the nitride etch step. It is to be understood that the chamber positions of the exemplary systems are for illustrative purposes only. The chambers can be positioned differently within the multichamber system and the multichamber system can include fewer or more chambers providing that there is at least one of each type of chamber required by the particular embodiment.

In order to perform a dielectric etch sequence according to the embodiments of the invention shown in FIGS. 3A–3D, a substrate it transferred into the multichamber substrate processing system, e.g., system 90 shown in FIG. 3A, through one of the load lock (LL) chambers. A central robot 92 then transfers a substrate from the LL chamber to the substrate processing chamber used to perform the first step of the integrated etch sequence (the dielectric etch), which is one of chambers A in each of FIGS. 3A–3D. After the process in chamber A is completed the substrate is transferred to the next chamber by robot 92. In the embodiment of FIG. 3A, the next chamber is one of chambers B where both the photoresist strip and etch stop layer etch through steps are performed on the substrate. When the integrated dielectric etch sequence is completed, the substrate is again transferred to one of the LL chambers for transfer out of multichamber substrate processing system 90.

For the embodiment shown in FIG. 3B, the substrate chamber transfer sequence for an individual substrate is one of chambers A, chamber C and then chamber D. In FIG. 3C, the sequence is one of chambers A for the dielectric etch, chamber C for the photoresist strip and another of chambers A to etch through the etch stop layer. Finally, in FIG. 3D the sequence is one of chambers A for the dielectric etch, chamber B for the photoresist strip and etch stop layer etch through and then chamber E for a wet clean. As would be understood by a person of ordinary skill in the art, when substrate processing system 90 includes multiple chambers to perform the same process step, two substrates can undergo processing by the system for the same process step in parallel. Thus, the embodiment of FIG. 3A allows for two substrates to simultaneously undergo the oxide etch step while for two other substrates either the photoresist layer is being stripped or the silicon nitride layer is being etched through.

II. Brief Descriptions of Exemplary Chambers Usable in the Present Invention

Figure 3E:
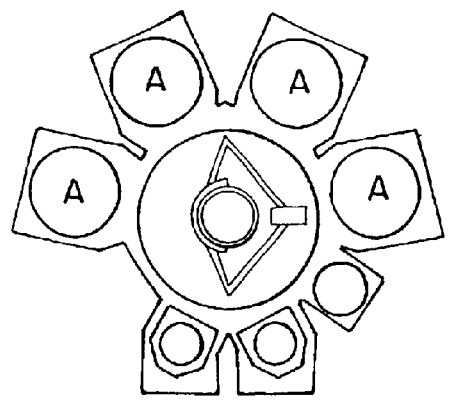
FIG. 3E is a simplified diagram of a multichamber substrate processing system that includes multiple chambers all designed to perform a single chamber in situ oxide etch process according to the prior art.

Any of the multichamber configurations of FIGS. 3A–3D provide reduced COO on a per wafer basis as compared to a Centura or other multichamber system that includes multiple chambers designed to provide single chamber in situ handling to perform the oxide etch sequence of steps 82, 84, 86. Such a single chamber in situ configuration is shown in FIG. 3E and may include all chambers A) which have sufficient capabilities to perform all of steps 82, 84, 86.

1. Chamber A

In one embodiment of the present invention each of chambers A shown in FIGS. 3A–3E can be a magnetically enhanced reactive ion etcher (MERIE) etch chamber, such as the MxP or SuperE chambers manufactured by Applied Materials. Alternatively, chambers A can be an inductive plasma source (IPS) etch chamber also manufactured by Applied Materials or any other high performance dielectric etch chamber capable of meeting the process performance requirements for the dielectric etch step. Generally, chambers A must be able to etch high aspect ratio vias and trenches (e.g., oxide etched vias with an aspect ratio of 6:1 or more) with an 89° or greater vertical profile at both the top and bottom of the via or trench to maintain the critical dimension.

Figure 4A:
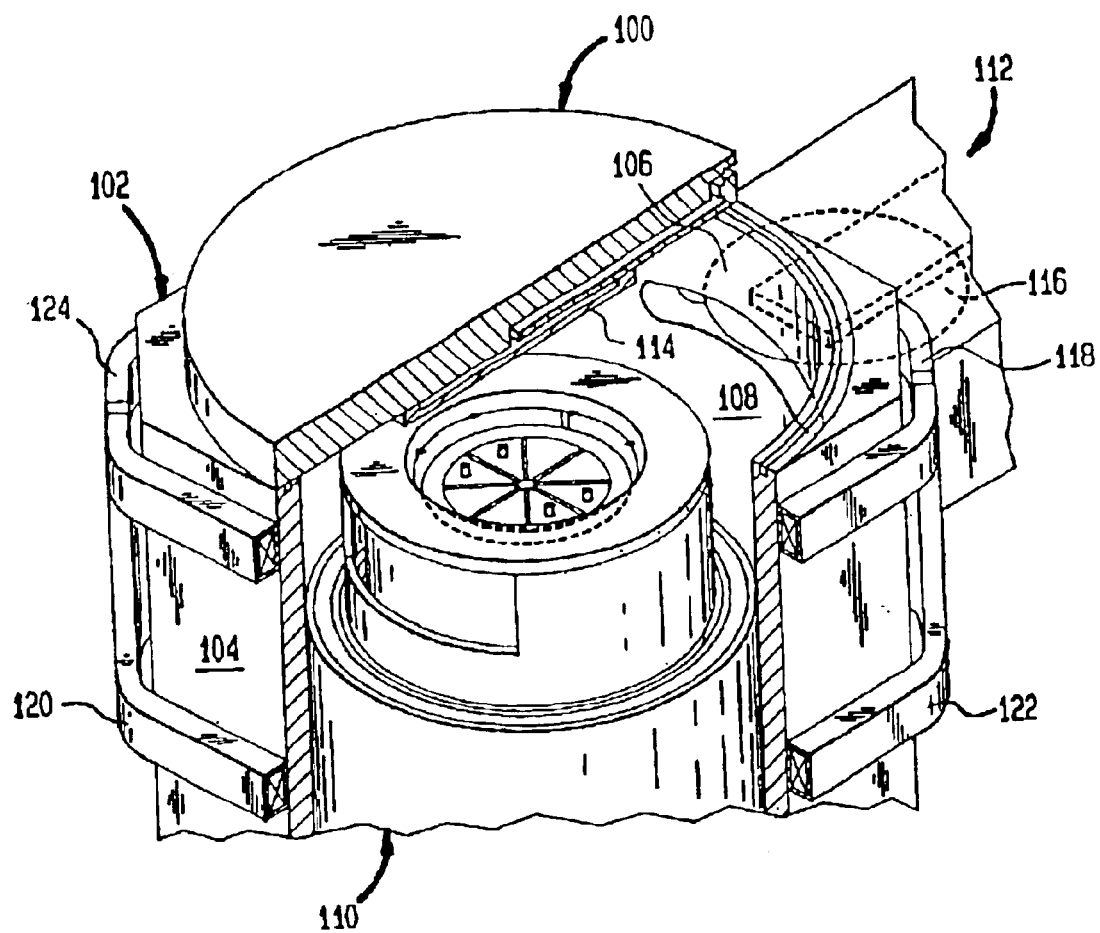
FIGS. 4A–4C are simplified diagrams illustrating various portions of a MERIE chamber which can be used as chamber A shown in FIGS. 3A–3D in some embodiments of the present invention.
Figure 4B:
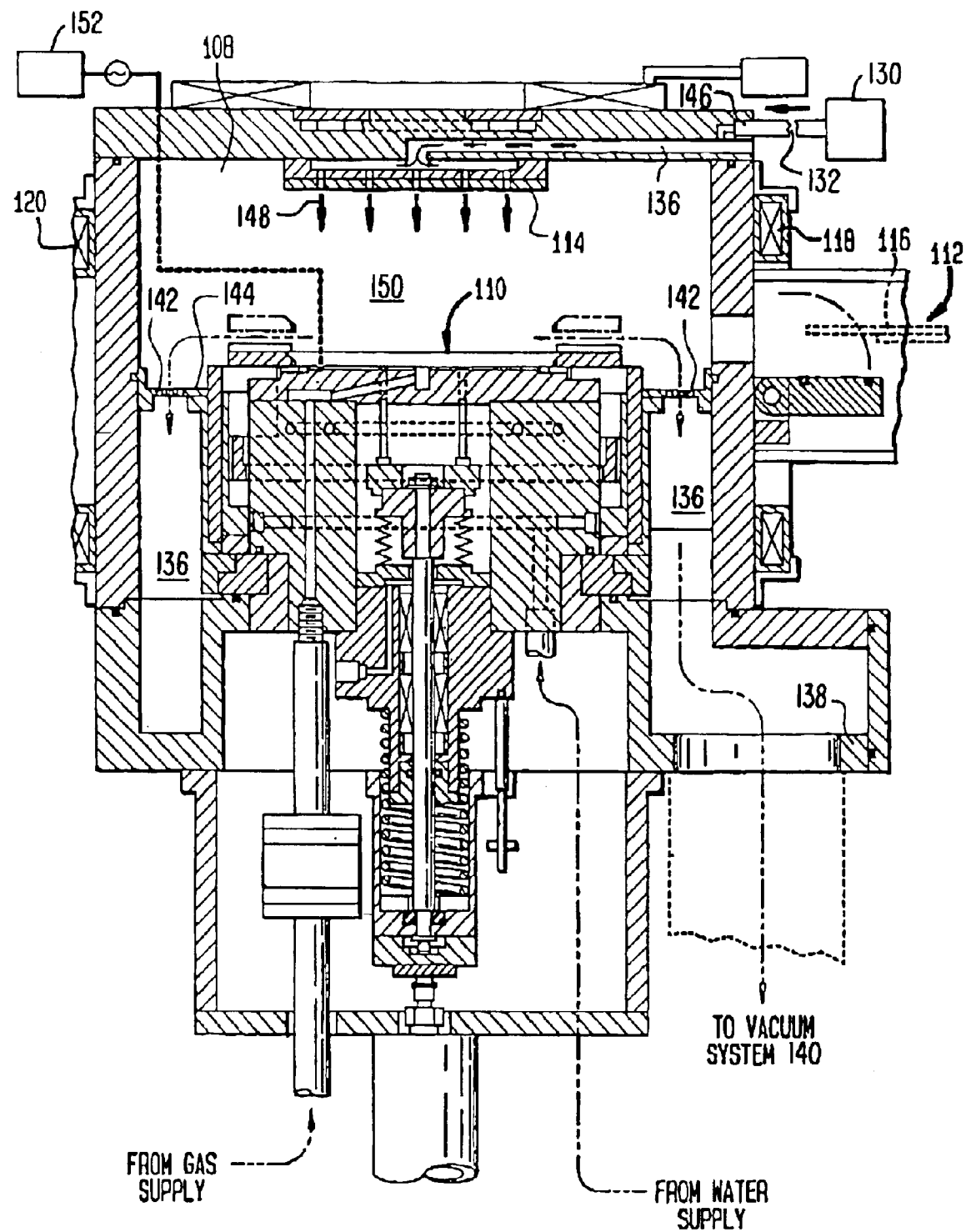
Figure 4C:
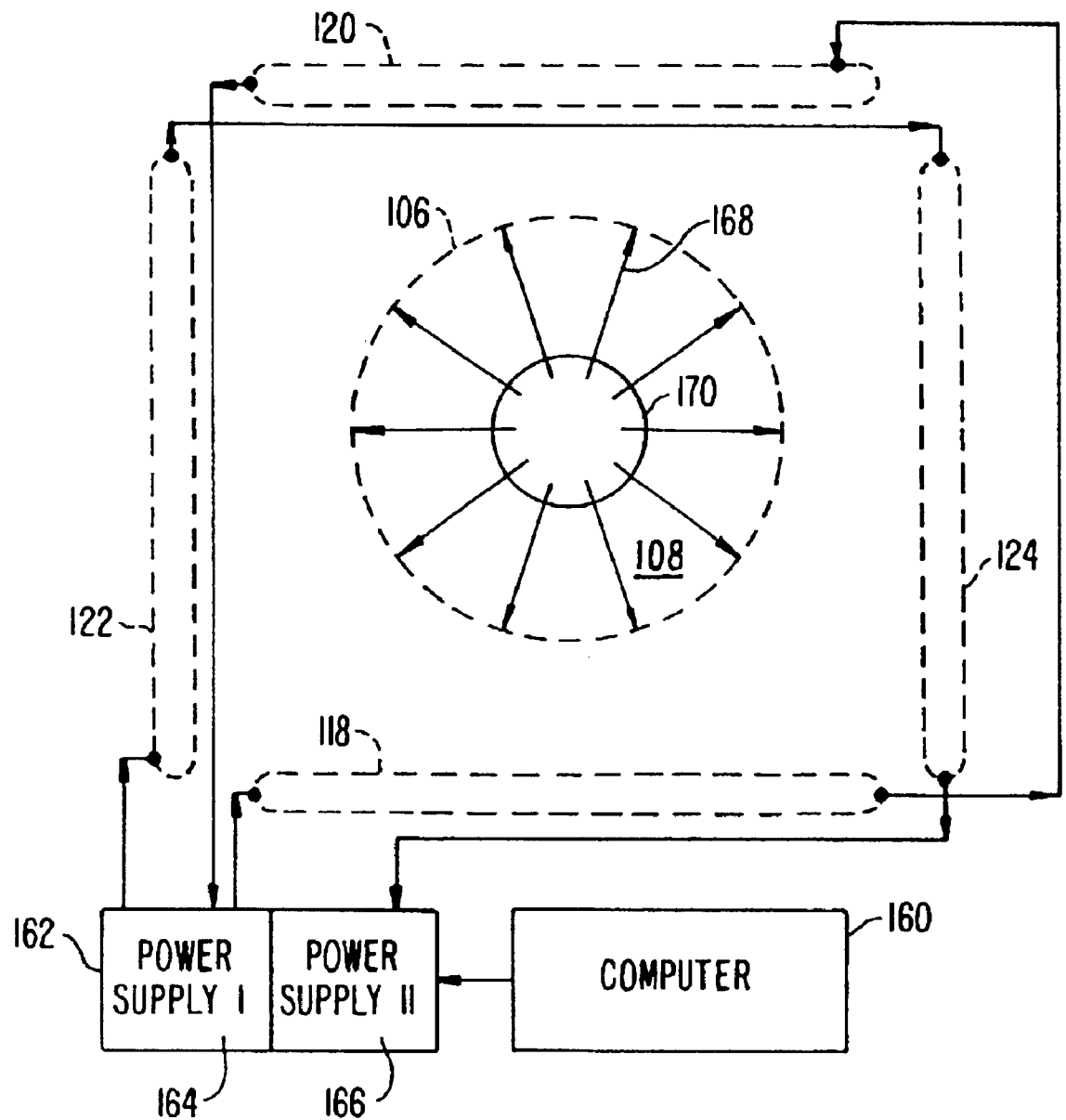

An exemplary chamber A is shown in FIGS. 4A to 4C, where FIGS. 4A and 4B are simplified cross-sectional diagrams of an MERIE chamber 100 and FIG. 4C is a simplified schematic representation of MERIE chamber 100. Referring to FIGS. 4A and 4B, chamber 100 includes a housing 102 having octagon-shaped outer walls 104 and a circular inner wall 106 defining a reaction chamber 108. The system also includes a gas and liquid cooled pedestal/cathode assembly 110 and a wafer (substrate) exchange system 112. The wafer exchange system 112 cooperates with the pedestal assembly 110 to facilitate positioning a substrate 116 upon assembly 110 and removing the substrate 116 from the chamber 108 after etching.

Process gases are supplied to the interior of the chamber 108 by a gas manifold 114 from a gas supply system 130. The gas supply system 130 communicates with the manifold 114 and chamber 108 via supply lines 132 and conduit 134.

Vacuum is supplied to the chamber and spent gases are exhausted via annular exhaust channel 136 communicating with exhaust port 138 connected to a high capacity vacuum pumping system 140 capable of evacuating the chamber to a pressure level of 5 mTorr and less. The exhaust flow is directed from the chamber 108 through holes 142 in a horizontal annular plate 144 mounted about the upper periphery of the cathode assembly 110. The plate 144 inhibits plasma penetration into the annular exhaust chamber 136.

Conduit 134 routes a reactant gas such as a fluorocarbon (CFx) from inlet 146 into manifold 114. The gas exits the manifold downwardly (as indicated by arrows 148. When RF power is applied to the cathode assembly 110 an etching plasma is formed in chamber processing region 150. An RF power supply system 152 supplies RF power to the reactor system 100 to generate the plasma. RF power system 152 is capable of maintaining a high bias RF power level to promote ion bombardment during the etch process.

To control the plasma, the reactor system 100 further includes a number of electromagnets 118, 120, 122 and 124, typically comprising copper coils, mounted in a rectangular array, one each on alternating outer walls of the octagon-shaped housing 104. As such, adjacent coils are substantially orthogonal to one another. Each coil is substantially rectangular in shape, having opposing upper and lower portions as well as opposing left and right portions that, taken together, define an opening within the rectangular shape of the coils. Each coil is fabricated of 310 turns of 14 gauge insulated, copper wire.

The array of four coils located about the periphery of the chamber places the left portion of each coil adjacent to the right portion of a neighboring coil. The ends of the upper and lower portions of the coils are turned inwardly toward the reaction chamber (by approximately 45 degrees) to substantially match the shape of the octagon-shaped housing.

The remaining component parts of the reactor system depicted in FIGS. 4A and 4B form an operational reactor system which can be used as chamber A in FIGS. 3A–3D. Referring now to FIG. 4C, a computer 160 is utilized to control the current that is applied to the electromagnets by power supply system 162. Such current control regulates the magnitude and direction (polarity) of the currents supplied to the electromagnets, the magnitude of the magnetic fields generated by the electromagnets and a resultant magnetic field vector formed by the combined magnetic fields generated by each of the electromagnets.

Each coil is connected to an independently controllable DC power supply 164 and 166. The computer 160 controls the current magnitude generated by each power supply. As such, the magnitude of the resultant magnetic field generated by the coils can be varied to select an etch rate and vary ion bombardment of the substrate. The current magnitudes are typically selected from a menu or table of current magnitudes in order to produce a controlled enhancement of plasma density and uniform etch rate. In response, the computer retrieves an appropriate command signal from a current magnitude table. Such current magnitude tables are stored in the memory of the computer 160.

The power supply system 162 applies the selected magnitude currents to the coils in the electromagnets while the reactor of FIGS. 4A and 4B processes a substrate or wafer. During such processing, the currents applied to the coils produce a rotating magnetic field generally transverse to the plane of the wafer that results in improved uniformity of the plasma over the surface of the wafer.

Another example of an MERIE reactor which could be used as chamber A is the DRM sold by Tokyo Electron of Japan, in which a rotating magnetic field transverse to the plane of the wafer is supplied by an array of permanent magnets mechanically rotating about the processing chamber. Other examples of chamber A embodiments could be high performance RIE reactors which may have multiple, separately controllable power inputs into different chamber electrodes, and which may also have power supplies operated at higher powers and frequencies, and furnishing multiple frequencies, as is well-known in the art.

Figure 5:
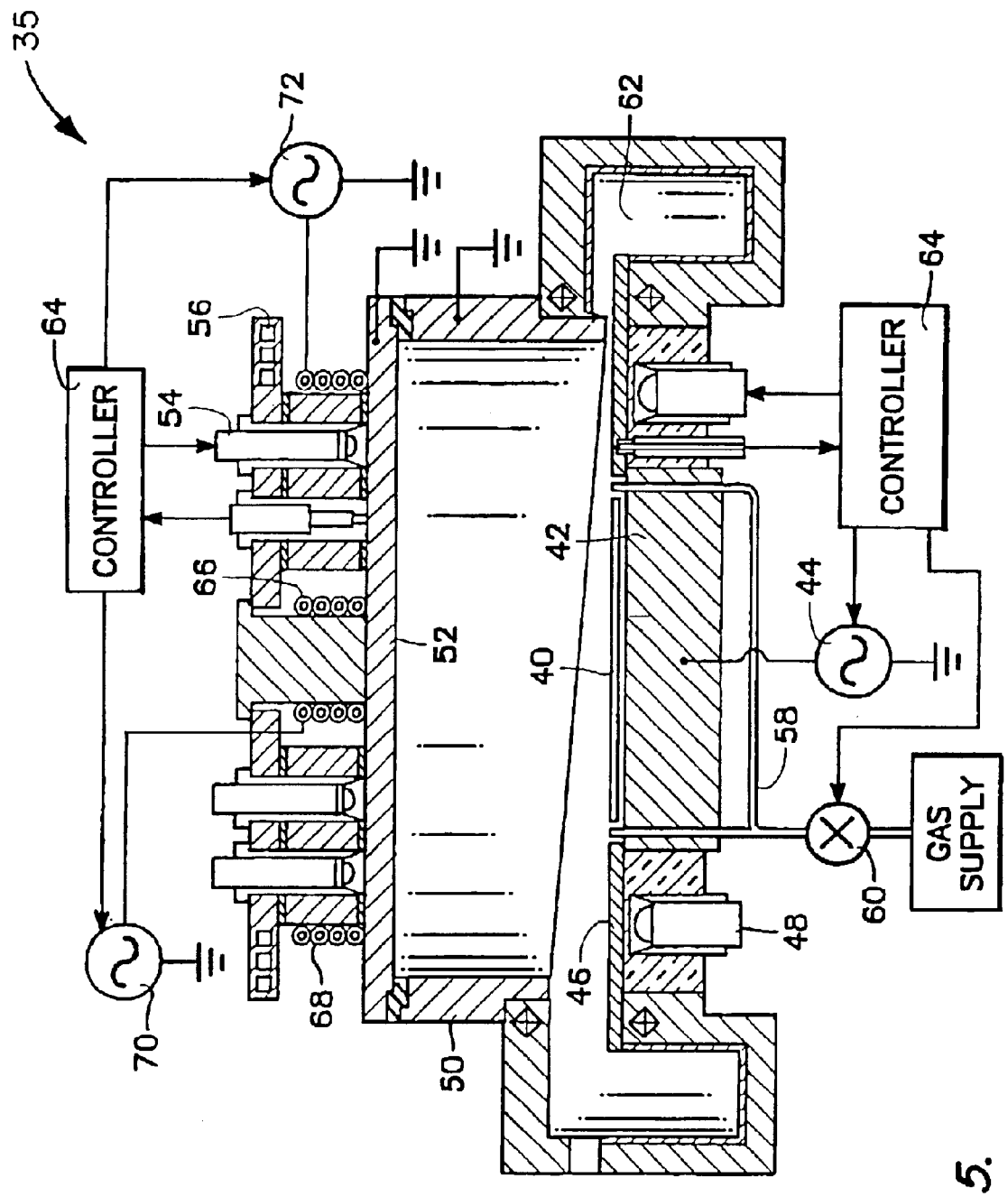
FIG. 5 is a simplified cross-sectional diagram of an IPS chamber which can be used as chamber A shown in FIGS. 3A–3D in some embodiments of the present invention.
Figure 6:
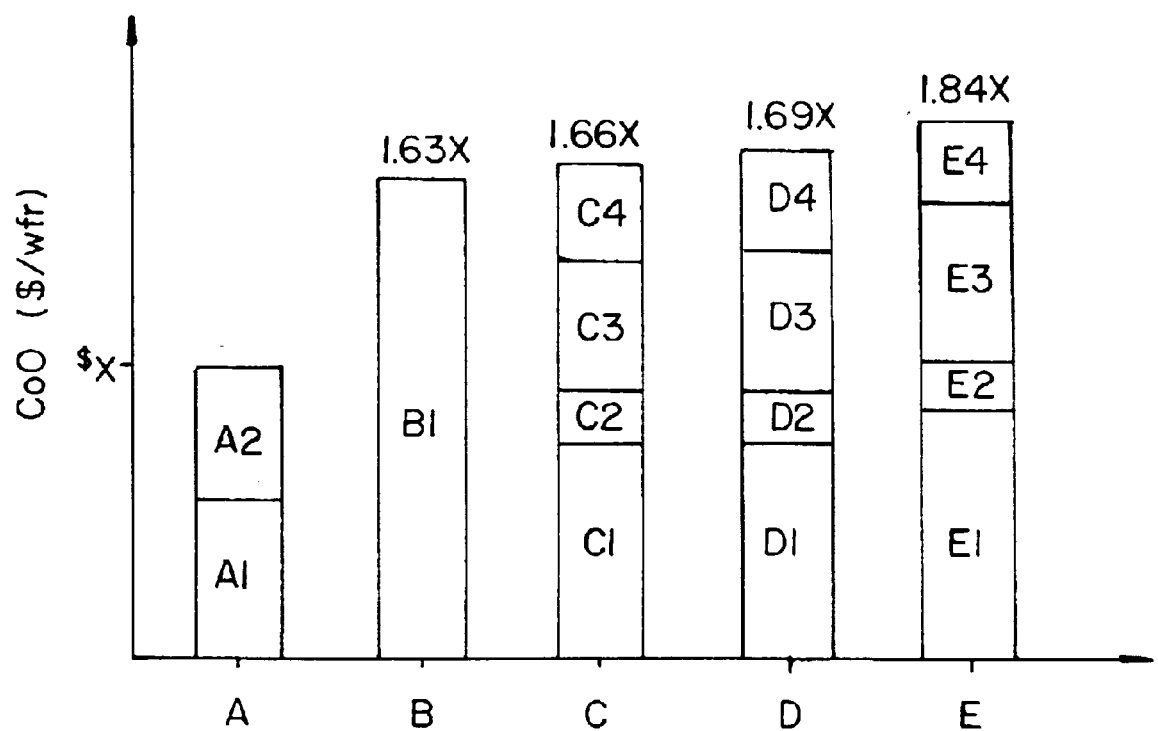
FIG. 6 is a bar graph comparing the cost of ownership of previously known equipment configurations to perform the oxide etch process to the cost of ownership of a system level in situ multichamber configuration according to the present invention.

Another exemplary chamber A is shown in FIG. 5, which is a simplified cross-sectional diagram of an IPS chamber 35. This reactor is illustrative of a new class of inductively coupled plasma reactors that are capable of generating a high-density plasma (HDP) and which separate the generation of the plasma from the biasing of the pedestal supporting the wafer. Such a reactor provides both the selectivity and the process flexibility required to satisfy the conflicting requirements of the many steps of an integrated in situ process. There are other types of high-density plasma reactors, including remote plasma source (RPS) and electron-cyclotron resonance (ECR). A high-density plasma may be defined as a plasma filling the entire space it is in, excluding plasma sheaths, and having an ionization density of at least $10^{11}$ ions/cm$^3$.

The general reactor structure and some auxiliary equipment of chamber 35 are illustrated in partial cross section in FIG. 5. As shown in FIG. 5, a wafer 40 to be processed within chamber 35 is supported on a cathode pedestal 42, which is supplied with RF power from a first RF power supply 44. A semiconductor silicon carbide ring 46 surrounds the pedestal 42 and is controllably heated by an array of heater lamps 48. A grounded silicon wall 50 surrounds the plasma processing area. A silicon roof 52 overlies the plasma processing area, and lamps 54 and water cooling channels 56 control its temperature. The temperature-controlled silicon ring 86 and to a lesser extent the silicon roof 52 can be used to scavenge fluorine from the fluorocarbon or other fluorine-based plasma. Processing gas is supplied from one or more bottom gas feeds 54 through a bank of mass flow controllers 56. Alternatively, a top gas feed may be formed as a small showerhead in the center of the silicon roof 52. A high capacity vacuum pumping system (not shown) connected to a pumping channel 58 around the lower portion of the chamber maintains the interior of the chamber at a preselected pressure. The pumping system includes a turbo molecular pump and a mechanical pump and can controllably evacuate the chamber to a pressure level less than 50 mTorr. A system controller 60 controls the operation of the reactor and its auxiliary equipment.

In the used configuration, the silicon roof 52 is grounded, but its semiconductor resistivity and thickness are chosen to pass generally axial RF magnetic fields produced by an inner inductive coil stack 66 and an outer inductive coil stack 68 powered by respective RF power supplies 70, 72. Alternatively, a single RF power supply may be used in conjunction with a selectable power splitter. Other coil configurations are possible, for example, as in the TCP reactor having a flat, spiral inductive coil overlying the roof 52 and as in the DPS sold by Applied Materials having a domed coil overlying a domed multiradius chamber roof. Both the foregoing are typically furnished with roofs of a non-silicon dielectric. It is of course possible, however, to use silicon or silicon bearing materials in the roof of these or other chambers as described above.

The system controller 60 controls the mass flow controllers 56, the heater lamps 48, 54, the supply of chilled water to the cooling channels 56, the throttle valve to the vacuum pumps, and the power supplies 44, 70, 72. All these regulated functions control the etching chemistry in conformance to a process recipe of the sort to be described in the examples below. The process recipe is stored in the controller 60 in magnetic, optical, or semiconductor memory, as is well known in the art, and the controller 60 reads the recipe from a recording medium inserted into it. It is typical for the equipment supplier to provide recipes on magnetic media such as floppy disks or optical media such as CDROMs, which are then read into controller 60.

The IPS inductively coupled plasma reactor allows different amounts of power to be supplied to the inductive coils 66, 68 and to the capacitate pedestal 42. The inductive power creates a plasma source region located in large part remotely from the wafer 40 while the capacitive power controls the plasma sheath adjacent to the wafer 40 and thus determines the DC bias across the sheath at the wafer 40. The source power can be raised to increase the etching rate and control the number and type of excited radicals while the bias power can be varied to cause ions to be accelerated across the plasma sheath with either high or low energy and which then strike the wafer 40 with the selected energy.

As described above, MERIE chamber 100 and IPS chamber 35 are examples of two different high performance etch chambers that could be used as chamber A shown in FIGS. 3A–3D. The minimum feature set that such a high performance etch chamber must include to be able to perform the demanding dielectric etch (e.g., oxide etch) step according to the present invention includes: (1) the ability to bias the wafer to promote ion bombardment during the etch process and maintain the bias level at a relatively high power level, i.e., 1000–2000 Watts for a chamber designed to process 8-inch substrates, (2) high pumping capacity with a high capacity vacuum pump system that is capable of evacuating the chamber to a process pressure level of 50 mTorr and below and preferably to at least a pressure level of 5 mTorr, (3) a low temperature control pedestal, and (4) the capability to manage polymer formation (i.e., either minimize or prevent formation of polymers on the chamber walls or force polymer deposition to chamber walls without particle formation or flaking as any formed particles may result in contamination problems during subsequent processing) during the etch process. Polymer formation can be managed by providing a chamber wall temperature control system within the walls of chamber 100 or chamber 35. Such a wall temperature control system can be in the form of fluid passages that circulate a heat exchange fluid, such as an ethylene glycol mixture, through the chamber walls or a resistively heated heating element embedded within the chamber walls among other techniques. If used to prevent formation of polymer on the chamber walls, the temperature control system heats the walls so that the reaction products and byproducts are maintained in gaseous form and do not deposit polymer on the walls. An additional benefit in preventing polymer formation on the chamber walls can be achieved if chambers A include a gas distribution system that establishes a gas flow that pumps particles out of the chamber and into the exhaust stream by flowing a purge gas from the bottom or sidewall of the chamber.

A high capacity vacuum system typically includes a turbo molecular pump and a mechanical pump but can include any appropriate vacuum system that enables pressure levels of 50 mTorr or less to be accurately maintained within the chamber. A low temperature control pedestal is capable of cooling the substrate to 0° C. or less during the etch operation. The availability of such temperature control allows process engineers to control the substrate temperature to improve etch selectivity to photoresist, increase the dielectric etch rate and prevent the photoresist from burning. One particular low temperature control pedestal circulates a liquid through the pedestal that is cooled by a chiller as is known to those of skill in the art.

2. Chamber B

Chambers B shown in FIGS. 3A and 3D are designed to perform both the photoresist stripping operation and silicon nitride or other stop layer etching operation in a single chamber. Therefore, chambers B are relatively versatile chambers but they do not require the same level of ultra high performance achievable by chambers A. Thus, to this end, chambers B typically do not require the silicon roof present in the IPS chamber described above or two or more separately controllable source RF power connections. Unlike chamber A architectures generally, Chamber B designs also do not require a high power RF bias system, or hardware to control polymer formations. In fact, Chamber B designs may not even require conventional capacitively coupled or inductively coupled plasma source power, but instead may be adequately powered by a remote plasma source, as described below. Chambers B typically employ a roof made from quartz, ceramic or a similar material that is more resistant to chemical attack than silicon. Manufacturing the roof out of such a chemically resistant material increases the lifetime of the roof so that it does not need to be replaced as often as a silicon roof. Preferably the material selected for the roof is sufficiently resistant to chemical attack during etch processes that the dome is not a consumable product (i.e., has a product lifetime of more than one year under continuous operation). The absence of these components from chamber B allows chamber B to perform the photoresist strip/silicon nitride etch at a significant cost advantage as compared to chamber A.

Instead, chambers B are designed and optimized to satisfactorily perform both the photoresist stripping operation and nitride etch operations for the dielectric etch process. In order to perform these steps chambers B include a high capacity vacuum system and a low power bias system that enables the chamber to maintain a relatively low bias power of less than about 200 Watts. The low power bias system includes an impedance matching network that is designed and optimized to operate at such low power levels. In one embodiment, the plasma generation system for chambers B includes a single source RF power generator coupled to a coil or rooftop electrode and a low bias RF power generator coupled to the pedestal. Low bias power is necessary to etch through the silicon nitride or other stop layer without causing excessive sputtering to the underlying copper layer in a dual damascene copper process. As an alternative to the inductively coupled source RF power system or capacitively coupled RF power system, chambers B may be powered by a remote microwave power source that generates plasma remotely and then flows chemically modified species or radicals into the substrate etching chamber. Chambers B also include hardware that enables the formation of an in situ plasma or a remote plasma formation system to enable a plasma dry cleaning step between every X photoresist strip and stop layer etch operations.

3. Chamber C

Chambers C shown in FIGS. 3B and 3C is specifically designed to perform the photoresist stripping operation which is sometimes referred to as a photoresist ashing operation. To this end, chamber C may include a remote plasma source that generates the ashing plasma remotely and flows the chemically modified species or radicals into the chamber to strip the photoresist layer at a relatively high rate, for example, greater than 2 microns per minute. Alternatively, chamber C may be a parallel plate etch chamber without the magnets included in MERIE type chambers. When the dielectric layer is a low k dielectric layer such as a carbon-doped silicon oxide layer, chamber C should also include a low temperature control chuck similar to that described above with respect to chamber A. Chamber C does not require a bias power capability and thus cannot satisfactorily perform either the oxide or silicon nitride etch steps in the dielectric etch process. Chamber C also does not require a high capacity vacuum pump and is instead fitted with a relatively simple mechanical pump. One example of a chamber C that can be used in certain embodiments of the present invention is a remote photoresist stripping (RPS) chamber manufactured by Applied Materials, the assignee of the present invention.

4. Chamber D

Chamber D shown in FIG. 3B is specifically designed to perform the silicon nitride etching operation. To this end, chamber D includes a high capacity vacuum system and a low power bias system of similar performance capabilities as those described above for chamber B. The plasma generation system for chambers D includes a low bias RF power generator coupled to the pedestal. Low bias power is necessary to etch through the silicon nitride or other stop layer without causing excessive sputtering to the underlying copper layer in a dual damascene copper process. Chamber D may be a MERIE type etch chamber. In one embodiment, chamber D is an MxP-family MERIE etch chamber manufactured by Applied Materials, Inc. furnished, however, with a low power bias source.

5. Chamber E

Chamber E, which is included in the embodiment of the invention shown in FIG. 3D, is a wet cleaning chamber that exposes the substrate to vapor of a solvent such as EKT or water as is known to those of skill in the art in order to remove polymer or other residuals build up, if any, within the etched structure. Chamber E includes a spraying/vaporizing nozzle that sprays the solvent at a high vapor pressure so that the solvent evaporates after reaching the substrate. The solvent is sprayed over the substrate while the substrate is positioned on a spinning pedestal in order to achieve a uniform coating across the entire surface of the substrate. It is important that the solvent evaporate so that when the substrate is transferred out of chamber E by the central robot through the-center wafer transfer chamber, liquid solvent does not drip off the substrate and contaminate the wafer transfer area.

III. Simulation Data Related to Cost of Ownership

FIG. 5 is a bar graph comparing the cost of ownership of previously known equipment configurations to perform the oxide etch process to the cost of ownership of a system level in situ multichamber configuration according to the present invention. Five different equipment configurations, labeled A through E, are shown along the X-axis in FIG. 5 while the Y-axis represents the cost of ownership of each of the various equipment configurations. In FIG. 5, configuration A represents the system level multichamber in situ etch process of the present invention; configuration B represents a single chamber in situ process and configurations C, D and E represent different ex situ equipment combinations as described more fully below.

Cost of ownership was calculated in FIG. 5 for the various equipment configurations using a cost of ownership software tool available from Sematech known as TooCool. In determining the COO using the TooCool program, the present inventors input data for each configuration that includes the price of the equipment, the costs of maintenance parts, the cost of labor associated with monitoring the tool, the cost of raw materials, e.g., gases, to perform the oxide etch process and the amount of space within a fabrication facility that the equipment for each configuration occupies, among other variables. Factors such as system up time and the expected utilization rate of the equipment was set to the same values for each configuration and thus did not have an impact on the calculated COO.

As clearly evident from FIG. 5, configuration A provides the overall lowest COO shown in FIG. 5 as $X. Configuration A represents the multichamber configuration shown in FIG. 3A described above. The COO for configuration A is broken into two components that are approximately equal in cost: the COO of the oxide etch chambers (A1) and the COO of the chambers designed for both photoresist strip and nitride etch steps 84, 86 (A2). Configuration A provides a significant COO advantage over all other known equipment configurations to perform the oxide etch process. Because configuration B represents a single chamber in situ solution, COO for configuration B is represented entirely by B1, which is approximately 1.63 times that of the COO of configuration A. COO for each of ex situ configurations C through E includes costs of the oxide etch equipment (C1, D1, E1), the photoresist stripper (C2, D2, E2), the nitride etch equipment (C3, D3, E3) and the wet bench (C4, D4, E4) that is necessary for ex situ solutions. Configuration C includes a magnetically enhanced reactive ion etcher (MERIE) to perform the oxide etch step 82, while configuration D includes another type of MERIE etcher to perform oxide etch step 82 and configuration E includes a capacitively-coupled etcher to perform oxide etch step 82.

Having fully described at least one embodiment of the present invention, other equivalent or alternative methods of practicing the present invention will be apparent to those skilled in the art. For example, while the present invention was primarily described in conjunction with a via-first dual damascene etch process, the invention is applicable to any dielectric etch process that etches through a primary dielectric layer and an etch stop layer and requires stripping a photoresist layer. Accordingly, the invention is applicable to a trench-first or self-aligned dual damascene etch process as well as non-dual damascene processes. These equivalents and alternatives along with the understood obvious changes and modifications are intended to be included within the scope of the present invention.

What is claimed is:

1. A method of forming a via hole in a semiconductor device in a multichamber substrate processing system having first and second etching chambers, the method comprising:

transferring to a first processing chamber a substrate having a patterned in mask overlying a dielectric layer that in turn overlies an etch stop layer and an underlying metallization layer;

exposing the substrate in the first processing chamber to a first etching chemistry reactive with the dielectric layer selective to the patterned mask, such that the dielectric layer is removed over the etch stop layer in unmasked regions to form via holes;

transferring the substrate to a second processing chamber without exposing the substrate to oxidizing conditions;

exposing the substrate in the second processing chamber to a second etching chemistry different from the first etching chemistry, the second etching chemistry reactive with the mask selective to the dielectric layer and the etch stop layer, such that the mask is removed over the dielectric layer; and then exposing the substrate in the second processing chamber to a third etching chemistry different from the first etching chemistry and from the second etching chemistry, the third etching chemistry reactive with the etch stop layer selective to the dielectric layer, such that the etch stop layer is removed over the lower interconnect metallization layer in regions revealed by the via holes.

2. The method of claim 1 wherein the dielectric layer comprises silicon oxide and the first chemistry is fluorine-based.

3. The method of claim 1 wherein the mask comprises photoresist and the second chemistry is oxidant-based.

4. The method of claim 1 wherein the etch stop comprises silicon nitride and the third chemistry is fluorine-based.

5. The method of claim 1 wherein only said first chamber comprises a magnetically enhanced reactive ion etching chamber.

6. The method of claim 1 wherein only said first chamber comprises a high density plasma etching chamber.

7. A method of preventing cross-contamination between processing steps performed in a multichamber substrate processing system having first and second etching chambers to create a via in a semiconductor device, the method comprising:

in a first chamber, exposing a substrate bearing a mask patterned over a dielectric layer, an etch stop layer, and an underlying interconnect metallization layer, to a first etching chemistry reactive to remove the dielectric layer in unmasked regions selective to the mask and the etch stop layer;

transferring the mask from the first chamber to a second chamber;

in the second chamber, exposing the substrate to a second etching chemistry reactive to remove the mask selective to the underlying dielectric layer and to the etch stop layer; and also in the second chamber, exposing the substrate to a third etching chemistry reactive to remove the etch stop layer selective to the dielectric layer and the lower interconnect metallization layer in regions revealed by prior removal of the dielectric layer in the first chamber.

8. The method of claim 7 wherein the dielectric layer comprises silicon oxide and the first chemistry is fluorine-based.

9. The method of claim 7 wherein the mask comprises photoresist and the second chemistry is oxidant-based.

10. The method of claim 7 wherein the etch stop comprises silicon nitride and the third chemistry is fluorine-based.

11. The method of claim 7 wherein only said first chamber comprises a magnetically enhanced reactive ion etching chamber.

12. The method of claim 7 wherein only said first chamber comprises a high density plasma etching chamber.

* * * * *